(12) United States Patent
Cavanna et al.

(10) Patent No.: US 6,904,558 B2
(45) Date of Patent: Jun. 7, 2005

(54) METHODS FOR COMPUTING THE CRC OF A MESSAGE FROM THE INCREMENTAL CRCS OF COMPOSITE SUB-MESSAGES

(75) Inventors: Vicente V. Cavanna, Loomis, CA (US); Patricia A. Thaler, Carmichael, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 459 days.

(21) Appl. No.: 10/080,886

(22) Filed: Feb. 22, 2002

(65) Prior Publication Data

US 2003/0167440 A1 Sep. 4, 2003

(51) Int. Cl.$^7$ ............................................. H03M 13/00
(52) U.S. Cl. ........................................ 714/781; 714/758
(58) Field of Search ................................. 714/781, 758, 714/782, 784

(56) References Cited

U.S. PATENT DOCUMENTS

| | | | | |
|---|---|---|---|---|
| 5,951,677 A | * | 9/1999 | Wolf et al. .................. 712/228 |
| 6,038,577 A | * | 3/2000 | Burshtein .................... 708/252 |
| 6,763,492 B1 | * | 7/2004 | Hurt et al. ................... 714/752 |

* cited by examiner

*Primary Examiner*—Joseph D. Torres

(57) ABSTRACT

Methods for adjusting an m-bit CRC of sub-messages are provided. Such adjustments enable the computation of the CRC of a message by XORing the partial or incremental CRCs of composite sub-messages corresponding to the sub-messages. In a first method, the contents of an m-bit memory location are field squared and stepped to the next state as determined by the Galois field generated by the CRC generating polynomial to adjust the m-bit CRC. In a second method, the partial m-bit CRC of a sub-message is calculated according to CRC generating polynomial, P(x). A variable Y is calculated using a lookup table, where $Y=x^n$ modulo P(x). The partial m-bit CRC and Y are multiplied together and divided by P(x). The remainder of the division forms the adjusted m-bit CRC.

9 Claims, 5 Drawing Sheets

METHODS FOR COMPUTING THE CRC OF A MESSAGE FROM THE INCREMENTAL CRCS OF COMPOSITE SUB-MESSAGES

FIELD OF THE INVENTION

This invention pertains generally to error detection and more particularly to a method of accumulating cyclic redundancy checks of sub-messages regardless of arrival order.

BACKGROUND OF THE INVENTION

Coding systems using cyclic redundancy check (CRC) techniques are readily implemented yet provide powerful error detection capabilities. Accordingly, CRC techniques are widely used in, for example, disk controllers, Internet protocols such as such as IP and iSCSI, and other networking protocols including ethernet. In the CRC technique, a block of d data bits denoted as a frame is joined with an extra block of m bits called the frame check sequence (FCS). Just like a checksum such as a parity bit, the FCS introduces redundancy into the transmitted (d+m) bit codeword that permits the receiver to detect errors. All the bits are treated as binary coefficients of polynomials. A receiver will detect errors in the received (d+m) bit codeword by dividing (using polynomial arithmetic) the codeword with a generator polynomial. If the remainder from this division is zero, a CRC-enabled receiver will assume that the transmitted codeword contains no errors.

As discussed above, certain Internet protocols require CRC coding to provide error detection. In these protocols, data may be packetized or divided into sub-messages for transmission. For example, an iSCSI data word may be protected with its CRC FCS and transmitted via multiple IP packets (which may be denoted as sub-messages) that may arrive in any order. The CRC coding of the FCS, however, is based on the original data word and not the IP packets/sub-messages. Conventionally, a receiver may perform a CRC calculation on the resulting sub-messages in one of two approaches. In a first approach to perform the CRC division/calculation, a conventional receiver could accumulate the sub-messages to reconstruct the message and divide the message by the generator polynomial. If the remainder from this division is zero, the message is assumed to be error free. Because the CRC division is performed after all the sub-messages have been received, there is extra latency causing undesirable delay. In addition, the receiver must have read access to the memory storing the accumulated sub-messages. Even if such memory access is practical, the extra loading on the memory bus further impacts system performance.

Alternatively, in a second approach to perform the CRC calculation, a receiver could compute the CRC remainder by performing a CRC division on each sub-message as it arrives in order using a CRC computation engine. In sequence processing of the sub-messages is required to ensure that the CRC computation engine has the proper initial state. The processed sub-messages could then be delivered to a remote memory not accessible to the CRC computation engine, eliminating the loading on the memory bus suffered by the previous approach. However, because the second approach requires in sequence delivery of the sub-messages, it cannot be applied where support of out of order sub-message delivery is required or desired.

Accordingly, there is a need in the art for a CRC computation technique that calculates the CRC of sub-messages regardless of arrival order.

SUMMARY

In accordance with one aspect of the invention, a method for adjusting a partial m-bit CRC is presented. In this method, a message is divided into a plurality of sub-messages. Each sub-message forms a composite sub-message which has zeroes in place of the data contained in the remaining sub-messages. The message thus equals the modulo-2 summation of the composite sub-messages. The partial m-bit CRC is formed by processing a sub-message in a CRC computation engine. The CRC computation engine uses either a primitive polynomial or an irreducible polynomial as the CRC generating polynomial. The resulting partial m-bit CRC is stored in a m-bit memory location.

With respect to the sub-message, the composite sub-message will have n trailing zeroes, wherein n is greater than or equal to zero and less than the number of bits in the original message. The partial m-bit CRC may be adjusted with respect to the n trailing zeroes. These n trailing zeroes may be represented by N, where N=n modulo $(2^m-1)$. In many protocols, the maximum message size is less than $2^m-1$, in which case N=n.

One of two methods is used to accelerate the computation of the adjusted CRC for the composite sub-message. The first method can be used when the CRC calculation is based on either a primitive polynomial or an irreducible polynomial as the CRC generating polynomial. The second method can be used for any CRC. Regardless of which method is implemented, the CRC for the message is obtained by taking the modulo-2 summation of the CRCs for the composite sub-messages.

The first method for accelerating the computation of an adjusted CRC for a composite sub-message uses the following process. Each bit of N is examined, in order from the most significant bit to the least significant bit. For each examined bit of N, the contents of the m-bit memory location are field squared. In addition, if the examined bit equals one, the contents of the m-bit memory location are advanced to the next state as determined by the Galois field defined by the CRC generating polynomial. After all the bits of N are examined in this fashion, the contents of the m-bit memory location will equal the adjusted CRC. The CRC of the message equals this modulo 2 summation of the adjusted partial CRCs.

In the second method, a message is divided into a plurality of sub-messages, wherein each sub-message corresponds to a composite sub-message having n trailing zeroes as discussed above. The partial m-bit CRC of a sub-message is calculated according to a CRC generating polynomial=P(x), wherein the generating polynomial P(x) does not have to be primitive or irreducible. To calculate the adjusted m-bit CRC of the sub-message, the method includes an act of computing a value $Y=x^n$ modulo P(x) using a lookup table. The partial m-bit CRC and Y are field multiplied together and the result field divided by P(x). The remainder of the division forms the adjusted partial m-bit CRC.

The following description and figures disclose other aspects and advantages of the present invention.

BRIEF DESCRIPTION OF THE DRAWINGS

The various aspects and features of the present invention may be better understood by examining the following figures, in which:

FIG. 9b is a flow chart for a table tookup technique for the method of FIG. 9a.

DETAILED DESCRIPTION

Figure 1:
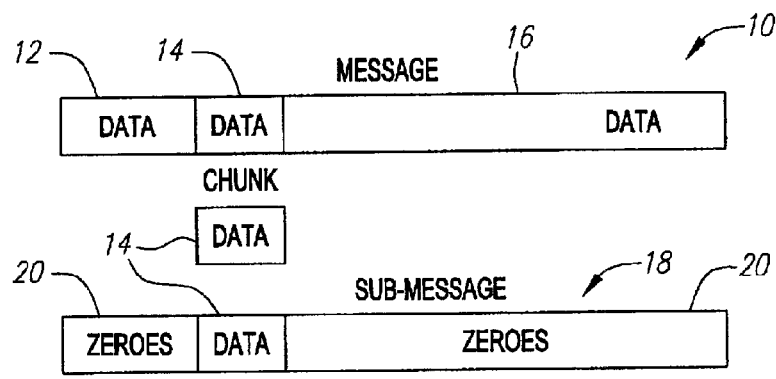
FIG. 1 is a graphical representation of a message divided into sub-messages and the composite sub-message corresponding to one of the sub-messages.

FIG. 1 illustrates a (d+m) bit binary message 10. Message 10 may be arbitrarily divided into chunks of bits denoted as sub-messages 12, 14, and 16. Message 10 can be expressed as the modulo-2 summation of the sub-messages. However, each sub-message must be modified with zeroes in place of the data from the remaining sub-messages. For example, consider sub-message 14. To be used in a modulo-2 summation to form message 10, sub-message 14 must be modeled as composite sub-message 18. As can be seen, composite sub-message 18 has zeroes 20 in place of the data from sub-messages 12 and 16. When modeled in this fashion, each composite sub-message will have the same length (number of bits) as the original message 10.

Because the CRC calculation is a linear transformation, the CRC of message 10 is a sum of the CRC of the composite sub-messages. If a conventional serial CRC computation engine is used to calculate the CRC of a composite sub-message, the leading zeroes may be ignored if the initial state of the CRC computation engine is zero. In such a case, to begin calculation of the CRC for a composite sub-message, the computation engine may begin by calculating the CRC of the corresponding sub-message. However, the resulting CRC of the sub-message must be adjusted to form the CRC of the composite sub-message. As used herein, the CRC of a composite sub-message will be denoted as a partial or incremental CRC. The required adjustment may be made by continuing to cycle the computation engine with no further input for as many clock cycles n as there are trailing zeroes.

In a first embodiment of the invention, which will be denoted the "optimal method," the CRC of a sub-message corresponding to a composite sub-message having n trailing zeroes may be adjusted in log n clock cycles to form the partial or incremental CRC. These incremental CRCs can then be modulo-2 summed (equivalent to exclusive ORing) in any order to form the CRC for the original message.

To understand the optimal method, certain coding concepts that are well known to one of ordinary skill in the art must be appreciated. For example, a field is a set of elements upon which two binary operations are defined. These binary operations may be referred to as "addition" and "multiplication." However, to prevent confusion with the usual binary operations of addition and multiplication, these field binary operations may be referred to as "field addition" and "field multiplication" using the symbols "+" and "*," respectively. In addition to other requirements, the result of either binary operation between two field elements must be equal to another element within the field. A field with a finite number of elements is of particular interest and is referred to as a "Galois field."

The simplest Galois field is the set of binary numbers {1, 0}, which is denoted as GF(2). In this case, the field addition and field multiplication binary operations are the familiar modulo-2 addition and modulo-2 multiplication. Using GF(2), coding theorists may construct extension Galois fields having $2^m$ elements denoted as $GF(2^m)$. To begin such a construction, consider a polynomial with a single variable x whose coefficients are from GF(2). As used herein, "polynomial" will refer only to polynomials having coefficients from GF(2). A polynomial with one variable x whose largest power of x with a nonzero coefficient is m is said to be of degree m. For example the polynomial $P(x)=x^4+x+1$ is of degree 4. As will be explained further herein, two types of polynomials are of particular importance for the optimal method: irreducible and primitive. An irreducible polynomial P(x) of degree m is not divisible by any polynomial of degree smaller than m but greater than zero. A primitive polynomial P(x) is an irreducible polynomial wherein the smallest possible integer n in which P(x) divides the polynomial $x^n+1$ is $n=2^m-1$.

A primitive polynomial of degree m can be used to generate the elements of a Galois field $GF(2^m)$. For example, consider the primitive polynomial $P(x)=1+x+x^4$. The degree of this polynomial is 4 so it may be represented by a 4 bit binary number (4-tuple representation). In general, a primitive polynomial of degree m can be used to generate $2^m-1$ unique states (ignoring the trivial all-zero state). Each state may have either a polynomial or m-tuple representation. It is customary to use the element $\alpha$ instead of x in the following discussion. Each polynomial may also be represented by a power of $\alpha$ (power representation) as will be explained further herein. The four simplest polynomials would simply be 1, $\alpha$, $\alpha^2$, and $\alpha^3$, respectively. These polynomials would correspond to a 4-tuple form (most significant bit first) as 0001, 0010, 0100, and 1000, respectively. The power representation corresponds directly to $\alpha^0$, $\alpha^1$, $\alpha^2$, and $\alpha^3$, respectively. Further powers of a may be developed by equaling the generating polynomial $P(\alpha)=1+\alpha+\alpha^4$ to zero. This leads to the recursive formula $\alpha^4=\alpha+1$. By continuing to multiply by a and apply the recursive formula, the powers of $\alpha$ may be derived as given by the following table.

TABLE 1

| Power Representation | Polynomial Representation | Binary (4-tuple Representation) |
| --- | --- | --- |
| 0 | 0 | 0000 |
| $\alpha^0$ | $\alpha^0$ | 0001 |
| $\alpha^1$ | $\alpha$ | 0010 |
| $\alpha^2$ | $\alpha^2$ | 0100 |
| $\alpha^3$ | $\alpha^3$ | 1000 |
| $\alpha^4$ | $\alpha + \alpha^0$ | 0011 |
| $\alpha^5$ | $\alpha^2 + \alpha$ | 0110 |
| $\alpha^6$ | $\alpha^3 + \alpha^2$ | 1100 |
| $\alpha^7$ | $\alpha^3 + \alpha + \alpha^0$ | 1011 |
| $\alpha^8$ | $\alpha^2 + \alpha^0$ | 0101 |
| $\alpha^9$ | $\alpha^3 + \alpha$ | 1010 |
| $\alpha^{10}$ | $\alpha^2 + \alpha + \alpha^0$ | 0111 |
| $\alpha^{11}$ | $\alpha^3 + \alpha^2 + \alpha$ | 1110 |

TABLE 1-continued

| Power Representation | Polynomial Representation | Binary (4-tuple Representation) |
|---|---|---|
| 0 | 0 | 0000 |
| $\alpha^{12}$ | $\alpha^3 + \alpha^2 + \alpha + \alpha^0$ | 1111 |
| $\alpha^{13}$ | $\alpha^3 + \alpha^2 + \alpha^0$ | 1101 |
| $\alpha^{14}$ | $\alpha^3 + \alpha^0$ | 1001 |

Examination of Table 1 shows that the various elements of this Galois field may be considered as states in a finite state machine. For example, if the state machine is in state 0110 ($\alpha^5$), the next state would be 1100 ($\alpha^6$). For a given state, the next state is achieved by multiplying by $\alpha$.

Another concept important to the invention is that of finite field squaring an element within the Galois field $GF(2^m)$ generated by a polynomial $P(x)$. As an example, consider again the generating (and primitive) polynomial $P(\alpha)=1+\alpha+\alpha^4$. If one of the polynomial elements in the resulting Galois field $GF(2^m)$ (represented as $b_3\alpha^3+b_2\alpha^2+b_1\alpha+b_0$) is finite field squared, it can be shown that the result is $b_3\alpha^6+b_2\alpha^4+b_1\alpha^2+b_0$. By using the recursion relationship $\alpha^4=\alpha+1$, the result becomes $b_3\alpha^3+(b_1+b_3)\alpha^2+b2\alpha+(b_0+b_2)$. Thus, given an arbitrary 4-tuple element $[b_3, b_2, b_1, b_0]$ from Table 1, it will be finite field squared by the circuit 24 shown in FIG. 2 to produce the 4-tuple element $[c_3, c_2, c_1, c_0]$. Because addition modulo-2 is equivalent to exclusive ORing, the modulo-2 addition of coefficients $b_1$, $b_3$, $b_0$, and $b_2$ is performed by XOR gates 26. Note that, in general, for a generating polynomial $P(x)$ of degree m, finite field squaring an m-tuple binary number is equivalent to multiplying modulo $P(x)$ the m-tuple binary number by itself.

Figure 2:
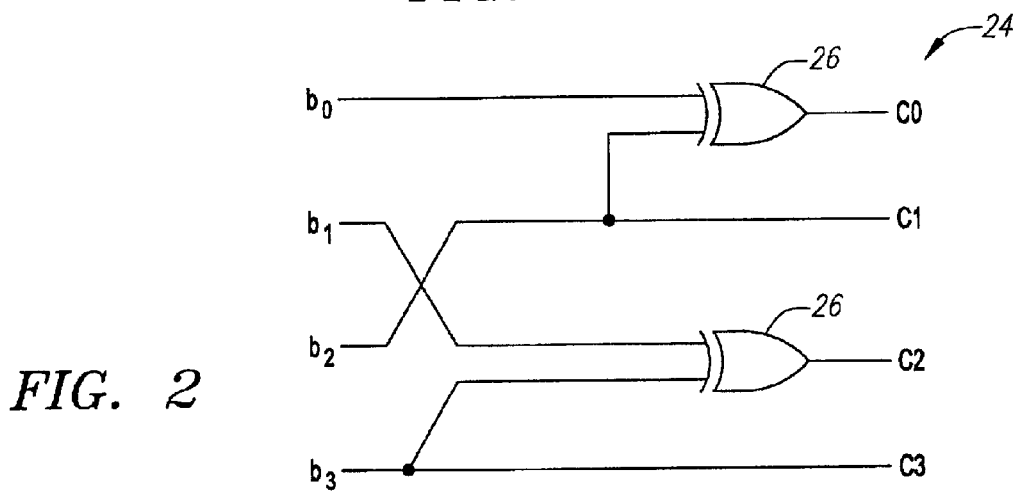
FIG. 2 is a logical representation of a circuit for performing the field squaring of a 4-tuple binary number according to a generating polynomial.
Figure 3:
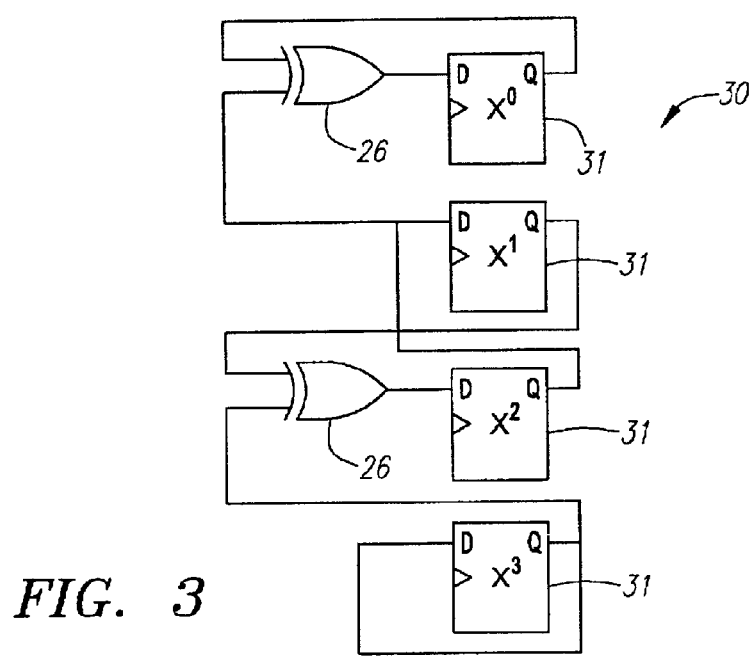
FIG. 3 illustrates a feedback shift register for performing the field squaring shown in FIG. 2.

Turning now to FIG. 3, a shift register 30 is shown for implementing the field squaring of a 4-tuple binary number, wherein the field is generated by the polynomial $P(x)=x^4+x+1$. Each stage 31 is a D-type flip-flop. Stages 31 store the 4 bits of the resulting 4-tuple binary number. Because this 4-tuple number may be construed as a polynomial, stages 31 are labelled accordingly from the term $x^0$ to the term $x^3$. The contents of each stage 31 may then be construed as the coefficient of the corresponding polynomial factor. These coefficients may be denoted as a 4-bit vector $Y(n)=[y_0, y_1, y_2, y_3]$, where $y_3$ through $y_0$ correspond to the contents of stages 31 $x^3$ through $x^0$, respectively. Vector $Y(n)$ may also be considered as the state of shift register 30. Each time stages 31 are clocked, the 4-tuple binary number is field squared. XOR gates 26 provide the same function as in FIG. 2. Comparing shift register 30 of FIG. 3 to the squaring transformation illustrated in FIG. 2 illustrates the identity. For example, $y_0(n+1)=y_0(n)^\wedge y_2(n)$, where $^\wedge$ represents the XOR operation. The next state $Y(n+1)$ of register 30 is derived from $Y(n)$. This next state is given by the expression $Y(n+1)=S \cdot Y(n)$, where S is the squaring matrix given by $$S = \begin{bmatrix} 1 & 0 & 1 & 0 \\ 0 & 0 & 1 & 0 \\ 0 & 1 & 0 & 1 \\ 0 & 0 & 0 & 1 \end{bmatrix}$$

Each row of the squaring matrix may be derived from examination of shift register 30. For example, from shift register 30 it can be seen that $y_1(n+1)=y_2(n)$. Thus, $y_1(n+1)=[0001] \cdot [y_0(n) \ y_1(n) \ y_2(n) \ y_3(n)]^T$, where T stands for operation.

Figure 4:
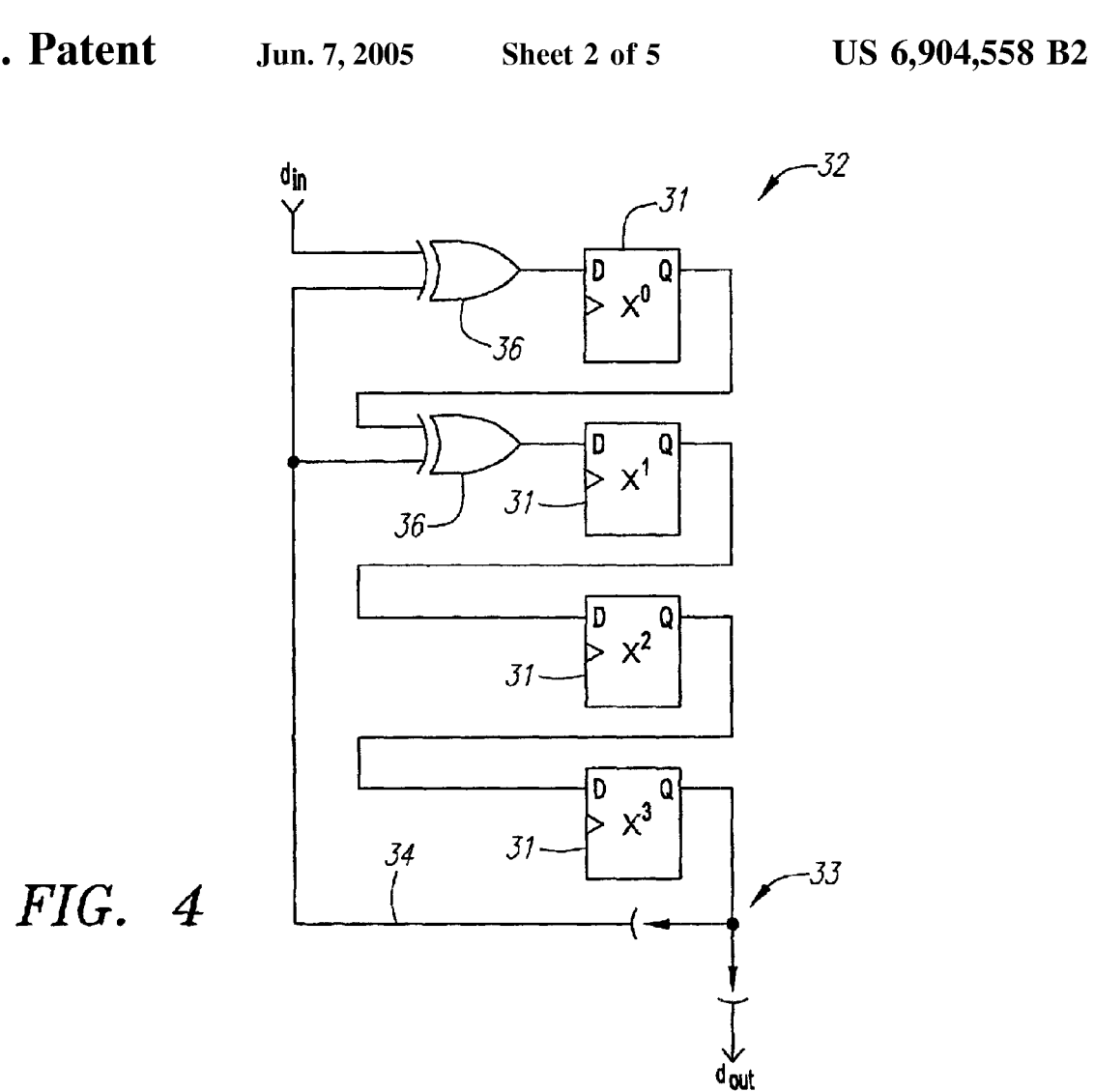
FIG. 4 illustrates a feedback shift register used as a CRC computation engine.

With these concepts in mind, the optimal method of the present invention may be discussed further. This method uses a conventional CRC computation engine to calculate the partial CRC of a composite sub-message. As is well known, such CRC computation engines may be implemented in either hardware or software, in either a serial or parallel configuration. Turning now to FIG. 4, a hardware implementation is illustrated using a feedback shift register 32 to calculate the CRC using the generating polynomial $P(x)=x^4+x+1$. Each stage 31 is a D-type flip-flop. As discussed with respect to FIG. 3, the contents of each stage (or equivalently, the state of register 32) corresponds to a vector $Y(n)$. Because this is the same generating polynomial as discussed above, the bits stored in the stages 31 of shift register 32 will correspond to the 4-tuple representation discussed with respect to the table 1. The bitstream carrying the sub-message is clocked in one bit at a time into the shift register 32 at the input, $d_{in}$. An XOR gate 36 receives this input and the Q output of stage 31 for bit $y_3(n)$ to form the D input for stage 31 holding bit $y_0(n)$. Similarly, another XOR gate 36 receives the Q output of stage 31 for bit $y_0(n)$ as well as the Q output of stage 31 for bit $y_3(n)$ to form the D input for stage 31 for bit $y_1(n)$.

During the CRC calculation stage, a switch 33 couples to feedback path 34 to maintain the required feedback. At each clock cycle, the 4-tuple binary number represented by the contents of the stages 31 advances to the next state of the Galois field defined by the generating polynomial $P(x)$, as discussed with respect to Table 1. Note that with respect to the received sub-message, the composite sub-message has n trailing zeroes as discussed with respect to FIG. 1. Should the shift register 32 be used without implementing the CRC computation technique of the present invention, switch 33 would be maintained in this position for these n additional clock cycles although no further data would enter at input $d_{in}$. After these n clock cycles, switch 33 couples to output $d_{out}$ so that the CRC may be read out.

Figure 5:
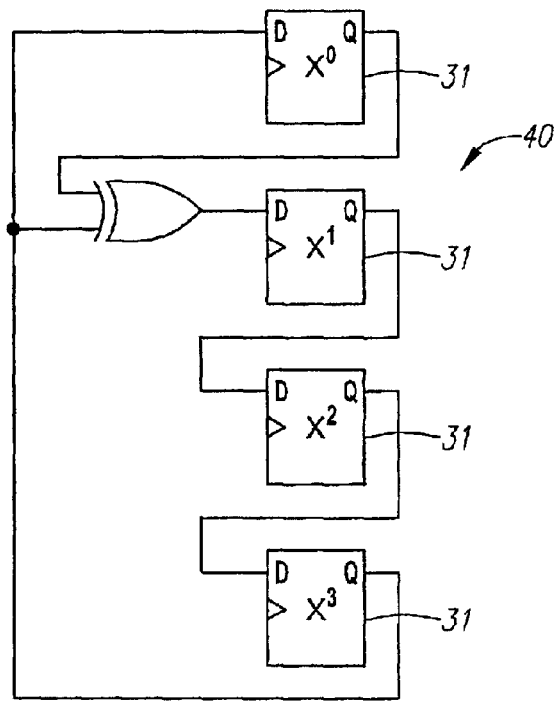
FIG. 5 illustrates the feedback shift register of FIG. 4 during the stage when it processes the n trailing zeroes.

Because switch 33 remains coupled to feedback path 34 and no data enters input $d_{in}$ during this time, feedback shift register 32 may be represented by the feedback shift register 40 of FIG. 5 during these n clock cycles. Here, stages 31 store the 4 bits $y_3(n)$ through $y_0(n)$ defining vector $Y(n)$ as discussed for shift register 30 of FIG. 4. Because the input $d_{in}$ of FIG. 4 is always zero as the n trailing zeroes are processed, the XOR gate 36 at the input to stage 31 holding bit $y_0(n)$ is absent. The bits $y_3(n)$ through $y_0(n)$ stored in stages 31 represent one of the elements of the Galois field generated by $P(x)$ as set forth in Table 1. By defining $y_3(n)$ through $y_0(n)$, shift register 40 forms a finite state machine whose present state (corresponding to the current clock cycle and denoted as the 4-bit vector $Y(n)$) is given by the current value of these bits. The next state $Y(n+1)$ of shift register 40 (corresponding to the next clock cycle) is computed from the present state $Y(n)$ by the linear relationship $Y(n+1)=A \cdot Y(n)$, where A is the state transition matrix and arithmetic is done modulo-2 (i.e, addition is an XOR operation). The columns of state transition matrix A are the binary representation of the states (in their power representation): $\alpha$, $\alpha^2$, $\alpha^3$, and $\alpha^4$. Thus, the state transition matrix A for this particular generating polynomial is as follows:

$$A = \begin{bmatrix} 0 & 0 & 0 & 1 \\ 1 & 0 & 0 & 1 \\ 0 & 1 & 0 & 0 \\ 0 & 0 & 1 & 0 \end{bmatrix}$$

Note that once the sub-message has been processed in shift register 32 of FIG. 4 (i.e., all the bits of the sub-message have been clocked into this register) shift register 32 must advance n states to adjust the CRC so that a partial CRC for the corresponding composite sub-message may be determined. Before this adjustment, stages 31 of shift register 32 store the unadjusted CRC for the sub-message. Rather than wait through n clock cycles, the following steps of the optimal method will adjust the CRC of the sub-message in as little as log(n) clock cycles.

Because shift register 32 has only 15 states, even if the number n of trailing zeroes exceeds 15, the actual number of states N that shift register 32 must be advanced is n modulo 15. Thus, n may be expressed as a 4-tuple number N, where N=modulo ($2^m-1$) of n (or n mod ($2^m-1$)). As a first step, each bit of N is examined, starting with the most significant bit. For each examined bit of N, whether 0 or 1, the contents of the shift register 32 are field squared using the shift register 30 discussed with respect to FIG. 3. In addition, for each examined bit that equals 1, the contents of the shift register 32 are advanced one state. When all bits of N have been examined, the CRC of the sub-message will have been adjusted to form the partial CRC of the corresponding composite sub-message.

Figure 6:
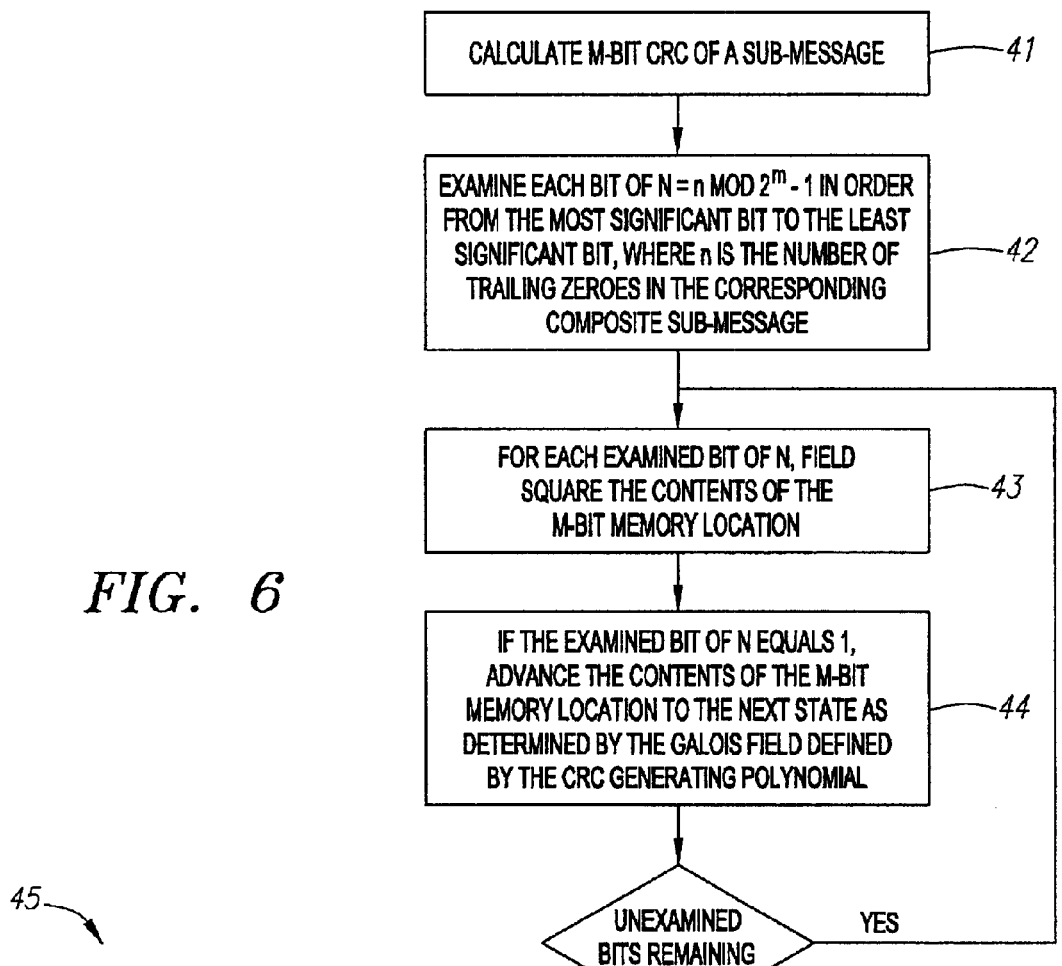
FIG. 6 is a flow chart for a method of adjusting a CRC according to one embodiment of the invention.

A flowchart for the optimal method is illustrated in FIG. 6. As a first step in the method, the sub-message m-bit CRC is calculated and stored in an m-bit memory location at step 41. The corresponding composite sub-message will have n trailing zeroes. At step 42, each bit of N=n mod ($2^m-1$) is examined in order from the most significant bit to the least significant bit. For each examined bit of N at step 43, the contents of the m-bit memory location are field squared. Finally, if the examined bit of N equals one at step 44, the contents of the m-bit memory location are advanced to the next state as determined by the Galois field defined by the CRC generating polynomial. Should bits of N remain unexamined, steps 43 and 44 repeat until all bits are examined.

Note that the preceding method may take up to two clock cycles for each bit of N (one clock cycle for the field squaring and potentially one more clock cycle for the advancing step should the examined bit of N equal one). By pre-combining the squaring and stepping matrices S and A, it is possible to perform both transformations (squaring and stepping) in a single clock cycle. The one state advance must be performed after the squaring such that a new matrix B=A·S is required. Given an m-tuple CRC at clock cycle n represented by the vector Y(n), the m-tuple CRC at clock cycle n+1 represented by Y(n+1) would be given by the linear relationship Y(n+1)=B·Y(n). With the matrices A and S being as described above, the B matrix for the generating polynomial P(x)=$x^4$+x+1 is as follows:

$$B = \begin{bmatrix} 0 & 0 & 0 & 1 \\ 1 & 0 & 1 & 1 \\ 0 & 0 & 1 & 0 \\ 0 & 1 & 0 & 1 \end{bmatrix}$$

Figure 7:
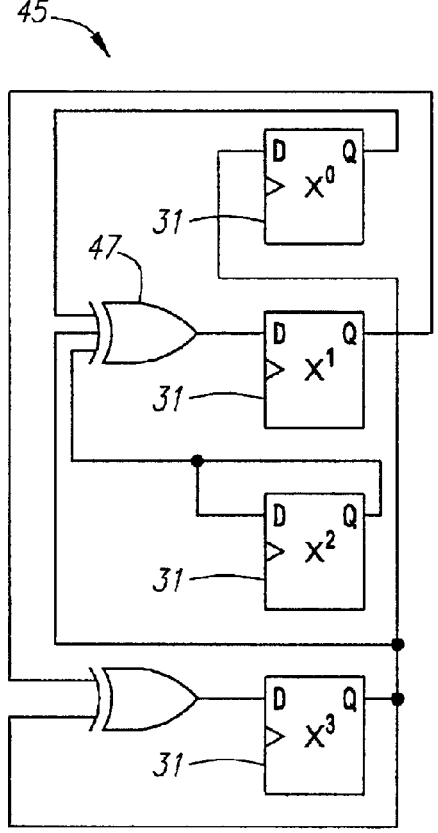
FIG. 7 illustrates a feedback shift register for simultaneously field squaring and stepping a state according to one embodiment of the invention.

Turning now to FIG. 7, a shift register 45 for performing the combined field squaring and stepping in one clock cycle is illustrated. Stages 31 store the CRC bits, which will be adjusted in one clock cycle. As discussed with respect to FIG. 5, the stored bits may be considered to form a vector Y(n)=[$y_0$(n) $y_1$(n) $y_2$(n) $y_3$(n)]. A comparison of shift register 45 with matrix B illustrates how shift register 45 performs the combined field squaring and stepping. For example, matrix B indicates that bit $y_1$(n+1) equals the modulo-2 addition of bits $y_0$(n), $y_2$(n), and $y_3$(n). Thus, shift register 45 has an XOR gate 47 at the input to stage 31 labelled $x^1$, where XOR gate 47 receives the outputs from stages 31 storing bits $y_0$(n), $y_2$(n), and $y_3$(n).

Figure 8:
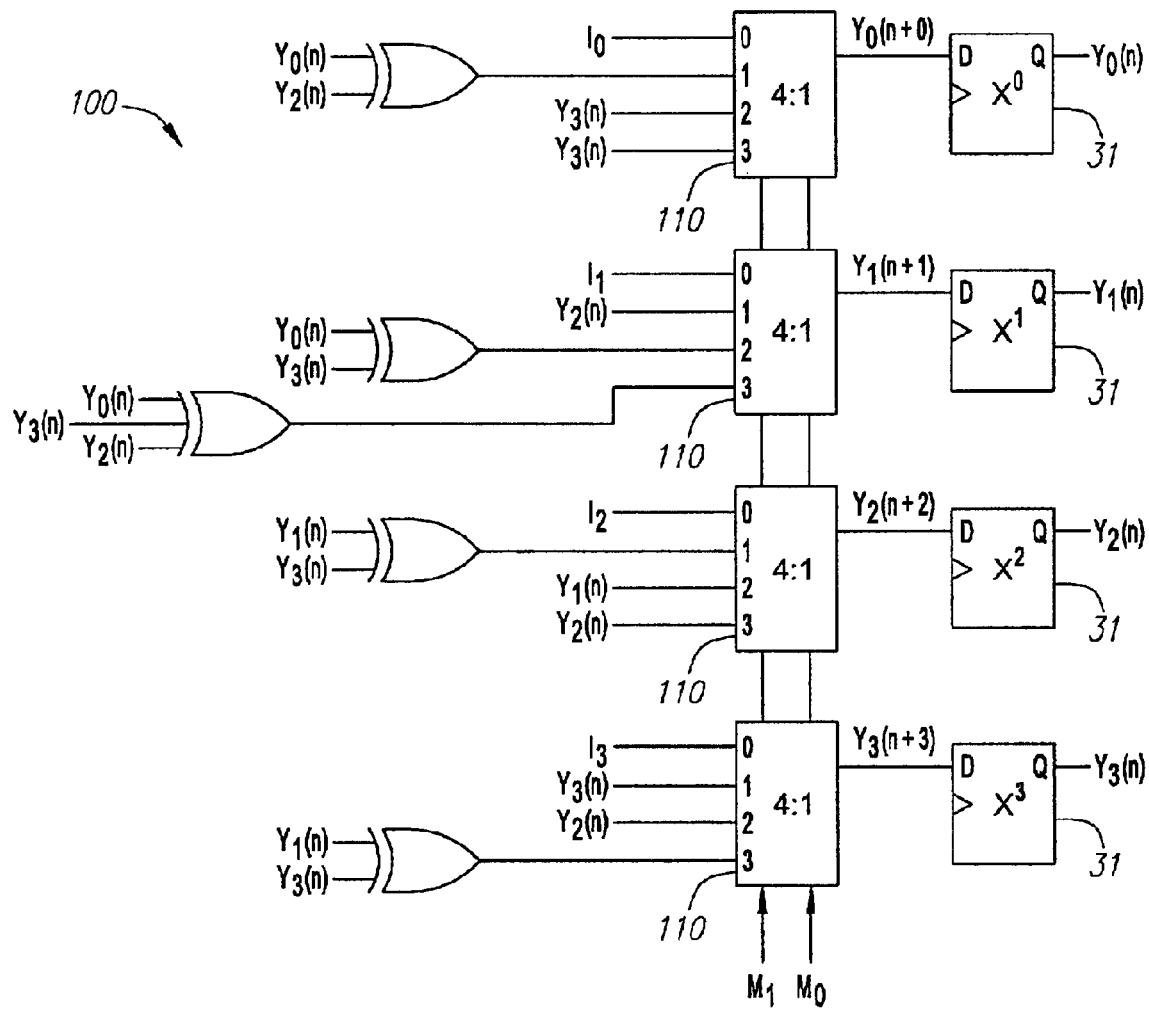
FIG. 8 illustrates a state machine having four modes of operation for adjusting a partial CRC according to one embodiment of the invention.

Turning now to FIG. 8, a state machine 100 for performing an m-bit CRC adjustment will thus have four modes of operation determined by bits $M_1$ and $M_0$. The CRC generating polynomial for state machine 100 is as discussed with respect to FIGS. 2 through 5. Although this generating polynomial is used as an example, it will be appreciated that state machine 100 may be generalized to correspond to whatever generating polynomial is desired. D-type flip-flops 31 store the CRC bits corresponding to the polynomial representation $x^3$ through $x^0$. These bits are defined with respect to clock cycles controlling each register 31. Thus, the Q output of a register 31 will correspond to the nth clock cycle whereas the D input of a register 31 will correspond to the Q output at the (n+1)th clock cycle. Bits $M_1$ and $M_0$ control 4:1 multiplexers 110. Each 4:1 multiplexer provides the D input for its register 31.

Each multiplexer 110 has four inputs, numbered from 0 to 3. If $M_1$=0 and $M_0$=0, multiplexers 110 will select for the zeroth input. . If $M_1$=0 and $M_0$=1, multiplexers 110 will select for the first input. If $M_1$=1 and $M_0$=0, multiplexers 110 will select for the second input. Finally, if $M_1$=1 and $M_0$=1, multiplexers 110 will select for the third input. Accordingly, the modes are as follows:

In a first mode of state machine 100, it will initialize by receiving the CRC of a sub-message, represented by bits $I_3$, $I_2$, $I_1$, and $I_0$ in order from most significant bit to the least significant bit. By setting bits $M_1$ and $M_0$ to zero and zero, respectively, this first mode is selected for by multiplexers 110. In a second mode, it will field-square the m bits stored by the state machine that represent the current state. By setting bits $M_1$ and $M_0$ to zero and one, respectively, this second mode is selected for by multiplexers 110. In a third mode, the state machine will advance its stored bits representing the current state to the next state. By setting bits $M_1$ and $M_0$ to one and zero, respectively, this third mode is selected for by multiplexers 110. Finally, in a fourth mode, the state machine will both field square and advance to the next state its stored bits representing the current state. By setting bits $M_1$ and $M_0$ to one and one, respectively, this fourth mode is selected for by multiplexers 110. Advantageously, the complexity of the field squaring operation (which is basically a field multiplier with both operands the same) is equivalent to the stepping transformation. This equivalent complexity is a result of the modulo P(x) and modulo 2 arithmetic. In contrast, a general binary multiplier is much more complex.

Note that the optimal method for adjusting a partial CRC is similar to a prior art algorithm of performing exponentiation of integers using a single accumulator. This algorithm is as follows. Suppose we want to compute $\beta^n$. The accumulator is initialized with 1 and the binary representation of the exponent n is inspected, in order from most significant bit (msb) first. For every bit of n, the current contents of the accumulator are squared. For every bit of n that equals 1, the accumulator is multiplied by $\beta$ after the squaring. After inspecting all bits of n, the accumulator will hold $\beta^n$. For example, suppose we want to raise $\beta$ to the power n=5. Table 2 below shows how the accumulator is initialized to 1 and how its contents are transformed at each step as the bits of n are inspected. After the last step, the accumulator contains $\beta^5(1^{16}*\beta^{4}*\beta^1)$ as expected. The reason the algorithm works is that, if we decompose the exponent into its powers of two, we can write the desired result, $\beta^5$, as $\beta^4+\beta^1$ and, by introducing $\beta$ as a new factor whenever n has a 1, that $\beta$ factor (and all others) will undergo the correct number of squarings.

TABLE 2

| n | Contents of the Accumulator in terms of factors | | | After clock # |
|---|---|---|---|---|
|  | 1 |  |  | 0 |
| 0 (msb) | $1^2$ |  |  | 1 |
| 1 | $1^4$ | B |  | 2 |
| 0 | $1^8$ | $\beta^2$ |  | 3 |
| 1 (lsb) | $1^{16}$ | $\beta^4$ | $\beta$ | 4 |

Note that this algorithm works only if the initial accumulator state is 1. As such, it is not directly applicable to the problem of adjusting a CRC, which will start from an arbitrary state.

As described above, a primitive polynomial of degree m has $2^m-1$ unique states (excluding the trivial case of all zeroes). Given a current state of a CRC computation engine programmed with a primitive polynomial, the next state is uniquely defined. Accordingly, such a CRC engine may be advanced to the next state during implementation of the optimal method. However, CRC computation engines programmed with an irreducible polynomial may also implement the optimal method of the present invention. For example, consider the irreducible polynomial given by $P(x)=x^4+x^3+x^2+x+1$. This polynomial will have the recursion relationship: $x^4=x^3+x^2+x+1$, which may be used to derive all of its states as given by the following Table 3.

TABLE 3

| Power Representation | Polynomial Representation | Binary (one of several possible 4-tuple representations) |
|---|---|---|
| $\alpha^0$ | $x^0$ | 0001 |
| $\alpha^1$ | X | 0010 |
| $\alpha^2$ | $x^2$ | 0100 |
| $\alpha^3$ | $x^3$ | 1000 |
| $\alpha^4$ | $x^3 + x^2 + x^1 + x^0$ | 1111 |
| $\alpha^5$ | $x^0$ | 0001 |
| $\alpha^6$ | X | 0010 |
| $\alpha^7$ | $x^2$ | 0100 |
| $\alpha^8$ | $x^3$ | 1000 |
| $\alpha^9$ | $x^3 + x^2 + x^1 + x^0$ | 1111 |
| $\alpha^{10}$ | $x^0$ | 0001 |
| $\alpha^{11}$ | $x^1$ | 0010 |
| $\alpha^{12}$ | $x^2$ | 0100 |
| $\alpha^{13}$ | $x^3$ | 1000 |
| $\alpha^{14}$ | $x^3 + x^2 + x^1 + x^0$ | 1111 |

Note that instead of 15 unique states (compared to a primitive polynomial of degree 4), there are only 5 unique states. However, because the number of unique states is a factor of 15, a CRC computation engine programmed with such an irreducible polynomial may be advanced to the next state as required by the optimal method. For example, consider the state given by the 4-tuple representation [1000]. Regardless of whether we designate this state as $\alpha^3$, $\alpha^8$, or $\alpha^{13}$, the next state is uniquely given by [1111].

In the more general case, where the CRC generating polynomial is neither primitive nor irreducible, the optimal method will not work because for certain states, the following state will not be uniquely determined. Because a CRC computation engine could not be advanced to the next state for these states, the optimal method would break down. However, the optimal method will work even in this general case if the initial starting state of the CRC computation engine is equal or congruent to one.

An alternate embodiment of the invention provides a method for CRC adjustment that will always work regardless of the form of the generating polynomial (i.e., regardless of whether the generating polynomial is primitive or irreducible). As used herein, this method will be referred to as the "general method." Compared to the optimal method, the general method is slower. However, the general method is much faster at adjusting a CRC than present known methods and shares most of the advantages of the optimal method.

The general method uses a well-known relationship from modular arithmetic that (x*y) mod m=(x mod m*y mod m) mod m where x, y and m are integers. This relationship also holds when x, y and m are polynomials. Computing the CRC of a message polynomial can be described mathematically as computing the residue of the message polynomial modulo the CRC polynomial. For simplicity we will ignore the fact that normally the message is pre-multiplied by $x^m$ to make room for the m-bit CRC.

A composite sub-message polynomial can be expressed as the product of the sub-message polynomial and $x^n$(the polynomial representing the bit stream of 1 followed by n zeroes) where n is the number of trailing zeroes. The above-mentioned mathematical relationship from modular arithmetic may be used to compute the adjusted partial CRC or $[x^n \cdot A(x)]$ mod $P(x)$ where n is the number of trailing zeroes, $P(x)$ is the generating polynomial, and $A(x)$ is the sub-message polynomial. Using the above relationship we can say that the above is equal to $[x^n \text{mod } P(x) \cdot A(x) \text{mod } P(x)]$ mod $P(x)$.

Figure 9A:
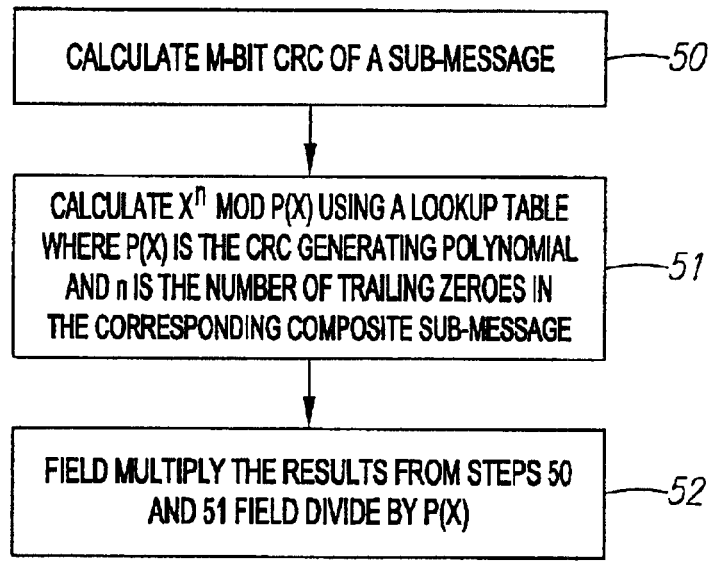
FIG. 9a is a flow chart for a method of adjusting a CRC according to one embodiment of the invention.

Turning now to FIG. 9a, a flowchart summarizing the general method is illustrated. At step 50, the general method computes $A(x)$ mod $P(x)$, the CRC of a sub-message without trailing zeroes (i.e. without regard to position). At step 51, compute $x^n$ mod $P(x)$ using a single lookup table. This step could be done in parallel with step 1. Finally, at step 52, combine the results from steps 1 and 2 by field multiplying together and field dividing by $P(x)$. The remainder produces the adjusted CRC.

Figure 9B:
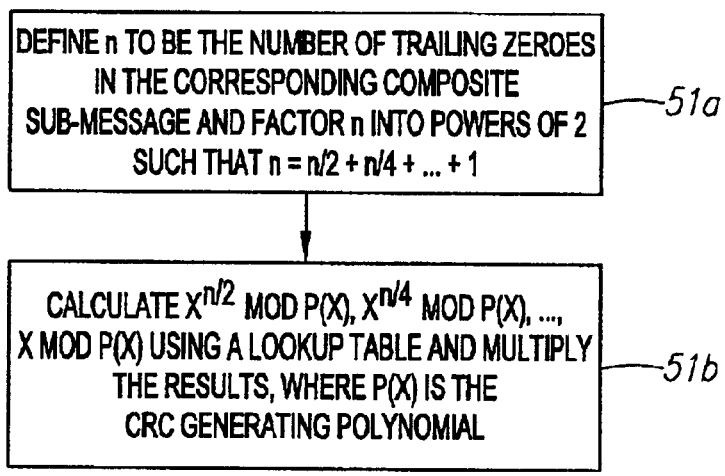

The table lookup performed in step 51 may be performed by factoring $x^n$ into powers of two and then multiplying. For example, $x^{27}=x^{16} \cdot x^8 \cdot x^2 \cdot x^1$, resulting in an initial table lookup for $x^{16}$ mod $P(x)$, $x^8$ mod $P(x)$, $x^2$ mod $P(x)$, and x mod $P(x)$ and then multiplying together the looked up results. Turning now to FIG. 9b, this specific table lookup method is illustrated. In step 51a, n is factored into powers of 2. In step 51b, each factor is table-looked up and then multiplied together. This factoring of n minimizes the size of the required lookup table. Note that when n is smaller than the degree of $P(x)$ there is no need for the table lookup and, because the polynomial has a single term, multiplication consists of simply shifting left.

The general method may use a circuit that will field multiply two short (same size as the CRC) polynomials together and will simultaneously field divide by $P(x)$ since we just want the remainder. The field division by $P(x)$ may be performed by a standard CRC computation engine. However, the multiplication requires more computation power than the optimal method for large CRCs. Also, the general method requires a lookup table. Should the exponent n be factored into powers of 2, then processing message sizes of 2n bits with the general method requires a look-up table with n entries. Each entry is the same size as the CRC. For instance, a message size of 16 K bytes with a 32 bit CRC would require a table of at most 17 32-bit entries.

Regardless of whether the optimal method or the general method is implemented, the present invention provides faster CRC computation than that provided by the prior art. Moreover, present CRC computation techniques implemented in software use a hardware offload computation engine that receives the entire message. Using the present invention, the message could be divided into several sub-messages, where each sub-message is processed by its own CRC computation engine working in parallel with the other engines. The adjusted CRCs of the sub-messages could then be put together using either hardware or software to compute the message CRC. In this fashion, the CRC computation could be parallelised.

In addition, pre-computation of fixed fields or the invariant parts of a message could be implemented to speed CRC computation time with the present invention. For example, a large binary word may be hashed into a smaller word of fixed size that can be used to index a table directly. In a hash table lookup, a large binary word is related to an entry in a table but the size of the binary word is too large for the binary word to be used directly as an index to the table. The present invention permits pre-computing part of the hash if some portion of the large binary word is known beforehand.

The invention may also be applied in routing or switching application, when changing address or other fields in a message and recomputing a CRC. When a router or switch changes values of some field in a packet, adjusting the CRC using the present invention takes significantly less time than computing a new CRC for the whole message. Furthermore, by computing an adjustment to the CRC rather than computing a new CRC, the packet continues to be protected against errors while in the router or switch. If a new CRC was computed and an error occurred in the switch/router between checking the original CRC and computing the new CRC, the packet would have a good CRC despite having been corrupted by an error. If the invention is used with respect to changes to fields in a packet, the CRC adjustment is calculated based on the bits that have been changed. In other words, the CRC adjustment is based on the XOR of the new and old field values. Alternatively, a CRC adjustment is subtracted from the old field values and a CRC adjustment is added for the new field values.

Other applications of the invention include signature analysis for hardware fault detection, computation of syndromes in error correction techniques, and quickly skipping over n states of a circuit that generates some sequence of all elements from a Galois field. In addition, the invention may be used to determine if a polynomial is primitive. Conventional techniques for determining whether a polynomial is primitive involve initializing a CRC register to a value and then cycling through all states to determine if the polynomial is maximal length. The number of operations of such a technique is proportional to the cycle length, which grows quickly with polynomial order. In contrast, should the calculation be performed according to the present invention, the number of operations would be proportional to the cycle length.

Thus, while specific examples of the present invention have been shown by way of example in the drawings and are herein described in detail, it is to be understood, however, that the invention is not to be limited to the particular forms or methods disclosed, but to the contrary, the invention is to broadly cover all modifications, equivalents, and alternatives encompassed by the scope of the appended claims.

We claim:

1. A method for adjusting an m-bit CRC of a sub-message, wherein a CRC generating polynomial for generating the m-bit CRC is primitive or irreducible and the sub-message corresponds to a composite sub-message having n trailing zeroes, where m and n are integers, comprising:

storing the m-bit CRC in an m-bit memory location;

examining each bit of N, where N is a binary representation of a result of n mod $(2^m-1)$, in order from a most significant bit to a least significant bit; the examining act for each examined bit comprising:

finite field squaring the contents of the m-bit memory location, and;

if the examined bit equals one, advancing the contents of the m-bit memory location to a next state as determined by the Galois field defined by the CRC generating polynomial.

2. The method of claim 1, wherein the CRC generating polynomial is a primitive polynomial.

3. The method of claim 1, wherein the CRC generating polynomial is an irreducible polynomial.

4. The method of claim 1, wherein for each examined bit equaling one, the finite field squaring act and the advancing the contents act are performed simultaneously.

5. A method for adjusting an m-bit CRC of a sub-message, wherein the sub-message corresponds to a composite sub-message having n trailing zeroes, where m and n are integers, comprising:

storing the m-bit CRC in an m-bit memory location;

examining each bit of N, where N is a binary representation of a result of n mod $(2^m-1)$, in order from a most significant bit to a least significant bit; the examining act for each examined bit comprising:

finite field squaring the contents of the m-bit memory location, and;

if the examined bit equals one, advancing the contents of the m-bit memory location to a next state as determined by a Galois field defined by a CRC generating polynomial for generating the m-bit CRC.

6. The method of claim 5, wherein the CRC generating polynomial is neither primitive nor irreducible.

7. A method of advancing an m-bit sequence through n states of a Galois field generated by a primitive or irreducible polynomial of degree m, where m and n are integers, comprising:

storing the m-bit sequence in an m-bit memory location;

examining each bit of N, where N is a binary representation of a result of n mod $(2^m-1)$, in order from a most significant bit to a least significant bit; the examining act for each examined bit comprising:

finite field squaring the contents of the m-bit memory location, and;

if the examined bit equals one, advancing the contents of the m-bit memory location to a next state as determined by the Galois field.

8. The method of claim 7, wherein the polynomial is a primitive polynomial.

9. The method of claim 7, wherein the polynomial is an irreducible polynomial.

* * * * *